(12) United States Patent
Koyanagi

(10) Patent No.: US 6,187,693 B1
(45) Date of Patent: Feb. 13, 2001

(54) HEAT TREATMENT OF A TANTALUM OXIDE FILM

(75) Inventor: Kenichi Koyanagi, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/439,346

(22) Filed: Nov. 15, 1999

(30) Foreign Application Priority Data

Nov. 13, 1998 (JP) ................................. 10-323655

(51) Int. Cl.$^7$ .................... H01L 21/31; H01L 21/469
(52) U.S. Cl. .................... 438/785; 438/240; 438/681; 438/778; 438/785
(58) Field of Search .................... 438/785, 778, 438/680, 681, 795, 798, 799, 240, 393, 396, 386

(56) References Cited

U.S. PATENT DOCUMENTS 5,521,423 * 5/1996 Shinriki et al. ................ 257/530

FOREIGN PATENT DOCUMENTS

| 58-134464 | 8/1983 | (JP) . |
| 2-283022 | 11/1990 | (JP) . |
| 5-102422 | 4/1993 | (JP) . |
| 6-163519 | 6/1994 | (JP) . |
| 10-223856 | 8/1998 | (JP) . |
| 10-229080 | 8/1998 | (JP) . |

OTHER PUBLICATIONS

Shinriki et al, UV–O3 and Dry–O2: Two step Annealed Chemical Vapor–Deposited Ta2O5 Films for Storage Dielectrics of 64–Mb DRAMs, IEEE Transactions on Electron Devices, vol. 38, No. 3, pp 455–462, Mar. 1991.*

Ohji et al, "Ta2O5 Capacitors' dielectric material for Giga–bit Drams", IEDM 95, pp 111–114, Dec. 1995.*

Matsui et al, "Reduction of Current Leakage in Chemical–Vapor Deposited Ta2O5 Thin–films by Oxygen–radical Annealing", IEEE Election Device Letters, vol. 17, No. 9, pp 431–433, Sep. 1996.*

* cited by examiner

Primary Examiner—Charles Bowers
Assistant Examiner—Thanhha Pham
(74) Attorney, Agent, or Firm—Young & Thompson

(57) ABSTRACT

A method of manufacturing a tantalum oxide film having a high dielectric constant suitable for use in a high density DRAM, and a small leakage current. After forming a tantalum oxide film in amorphous state which includes moisture and impurities such as organic substances, and before crystallizing the film, the tantalum oxide film in amorphous state is subjected to a first heat treatment at a temperature which is higher than the formation temperature of the tantalum oxide film in amorphous state and which is lower than the temperature of crystallization of the tantalum oxide film in amorphous state. As a result of the first heat treatment, the moisture and the impurities such as organic substances existing in the film are surely removed from the film. Accordingly, in a subsequent heat treatment for crystallization at a high temperature, there arises no phenomenon in which crystallization of the film proceeds while impurities in the film are being removed. In other words, the crystallized tantalum oxide film obtained is free from stresses and defects.

14 Claims, 6 Drawing Sheets

HEAT TREATMENT OF A TANTALUM OXIDE FILM

BACKGROUND OF THE INVENTION

1. Field of the Invention

The present invention relates to a manufacturing method of a tantalum oxide film, and more particularly to a semiconductor device employing a tantalum oxide film.

2. Description of the Related Art

Heretofore, a high dielectric constant material has been required as the capacitor insulating film.

In particular, a tantalum oxide film has been considered to be a promising candidate for such a film, and has been studied widely. As the formation method of the tantalum oxide film, it is general to adopt a chemical vapor deposition (CVD) method using an organic tantalum. A tantalum oxide film formed by the CVD method is in amorphous state immediately after its formation, and includes moisture and impurities such as organic substances in the film.

Subjecting a tantalum oxide film in amorphous state to a heat treatment in an inert atmosphere at 800° C. has been disclosed in Unexamined Patent Applications Laid Open, No. Sho 58-134464. However, according to the manufacturing method in this invention, the tantalum oxide film in amorphous state is crystallized while a large amount of impurities existing in the film are removed through the heat treatment at 800° C. Accordingly, in this manufacturing method, a large strain is generated in the crystallized tantalum oxide film, so it gives rise to a problem that many defects occur in the film.

Moreover, in Unexamined Patent Applications Laid Open, No. Hei 10-223856 there is disclosed a crystallization treatment of a tantalum oxide film in an active oxygen atmosphere. According to the technique disclosed in this invention, first, an amorphous tantalum oxide film including crystallized tantalum oxide in some parts is formed, then by subjecting it to a low temperature heat treatment in an active oxygen atmosphere, the amorphous tantalum oxide film including crystallized tantalum oxide in some parts is converted to a crystallized tantalum oxide film. However, according to this manufacturing method many defects are generated in the crystallized tantalum oxide film, analogous to the above-mentioned invention, and results in a problem that the defects become the cause of leakage current.

Furthermore, in Unexamined Patent Applications Laid Open, No. Hei 2-283022, a method is disclosed in which after a tantalum oxide film is formed by a CVD method, a heat treatment in an ozone atmosphere at 300° C. is given, then the product is subjected to a heat treatment for crystallization in an oxidizing atmosphere at 800° C.

Similarly, in Unexamined Patent Applications Laid Open, No. Hei 5-102422 is disclosed a method in which after formation of a tantalum oxide film, the tantalum oxide film is thoroughly oxidized by a heat treatment in an oxygen or ozone atmosphere, then the tantalum oxide film is further subjected to a heat treatment in an oxygen atmosphere at 800° C. for crystallization.

In both of the last two inventions, the amorphous tantalum oxide film is subjected to a heat treatment prior to the heat treatment for its crystallization at a high temperature. However, an oxidation treatment at a low temperature of about 300° C. leaves moisture and impurities such as organic substances included in the film. Consequently, in the subsequent heat treatment of the amorphous tantalum oxide film for crystallization at a high temperature, the film is crystallized while a large amount of impurities are being removed, which gives rise to a problem that the crystallized tantalum oxide film contains many defects in it.

In addition, Unexamined Patent Applications Laid Open, No. Hei 10-229080 relates to the manufacture of an amorphous tantalum oxide film. In this invention is disclosed a method in which after the formation of a tantalum oxide film, the film is subjected to a heat treatment in an ozone atmosphere at a temperature in the range of 300 to 500° C. According to this technique, an amorphous tantalum oxide film not yet crystallized, formed in the manufacturing method as described in the above, is used as an insulating film for a capacitor.

Moreover, Unexamined Patent Applications Laid Open, No. Hei 8-69998 relates to the manufacture of an amorphous tantalum oxide film. This invention discloses a method in which a tantalum oxide film is subjected to a heat treatment in a low temperature ozone or oxygen plasma at 400° C. According to this technique an amorphous tantalum oxide film not yet crystallized, formed in the manufacturing methods as described in the above, is used as an insulating film for a capacitor.

Moreover, Unexamined Patent Applications Laid Open, No. Hei 6-163519 also relates to the manufacture of an amorphous tantalum oxide film. This invention discloses a method of manufacturing an amorphous tantalum oxide film by subjecting a tantalum oxide film to a heat treatment in an oxidizing atmosphere at a temperature in the range of 450 to 600° C.

SUMMARY OF THE INVENTION

It is the object of the present invention to provide a method of manufacturing a tantalum oxide film having a high dielectric constant suitable for use in a high density DRAM, few defects in the film, an excellent breakdown strength, and little leakage current, by improving the drawbacks in the conventional techniques as described above, as well as to provide a semiconductor device employing the tantalum oxide film thus formed.

In the conventional techniques in the above, the amorphous tantalum oxide film is subjected to an oxidation treatment at a low temperature prior to a heat treatment at a high temperature for crystallizing the film. However, even when the amorphous tantalum oxide film is subjected to a heat treatment at a low temperature, it is not possible to remove moisture and impurities such as organic substances existing in the film, so they are left intact in the film. Accordingly, when the amorphous tantalum film including impurities is subjected subsequently to a heat treatment for crystallization at a high temperature, the crystallization proceeds while the large amount of impurities in the film being removed. As a result, there arises a problem that the crystallized tantalum oxide film includes a large number of defects. The present method of manufacturing a tantalum oxide film is characterized in that after the formation of a tantalum oxide film in amorphous state, it is subjected to a heat treatment at a temperature higher than the temperature for film formation and is lower than the temperature for crystallization of the amorphous tantalum oxide film in amorphous state. Following this, the tantalum oxide film in amorphous state is crystallized.

In this invention, a tantalum oxide film in amorphous state including moisture and impurities such as organic substances is subjected, prior to its crystallization, to a heat treatment at a temperature which is higher than the film formation temperature of the tantalum oxide film in amorphous state and is lower than the crystallization temperature of the tantalum oxide film in amorphous state. As a result of this heat treatment, moisture and impurities such as organic substances existing in the film are removed completely from the film. Accordingly, in the subsequent high temperature for crystallization, crystallization while impurities being removed from the film will not take place. In other words, the crystallized tantalum oxide film formed is free from strains and defects in the film.

Moreover, it is also preferable to subject the amorphous tantalum oxide film to a first heat treatment at a temperature which is higher than the temperature for film formation of the tantalum oxide film in amorphous state and is lower than the temperature for crystallization of the tantalum oxide film in amorphous state, then subjecting the film to a second heat treatment in an active oxygen atmosphere at a low temperature before finally subjecting the film to the heat treatment for crystallization. In this method, the heat treatment for crystallization is carried out after supplementing oxygen in the second heat treatment to the portions from which impurities in the film are removed by the first heat treatment. Accordingly, at the heat treatment for crystallization, oxygen is supplemented to the portions of the film from which impurities are removed. As a result, in the heat treatment for crystallization, crystallization will not proceed in a manner in which impurities are removed from the film while it goes on. In other words, the crystallized tantalum oxide film formed is free from strains and defects in the film.

BRIEF DESCRIPTION OF THE DRAWINGS

The above and other objects, advantages and features of the present invention will be more apparent from the following description taken in conjunction with the accompanying drawings, in which.

BRIEF DESCRIPTION OF PREFERRED EMBODIMENTS

Figure 1A:
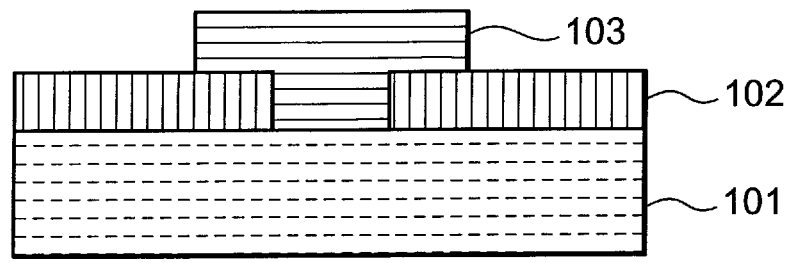
FIG. 1(A) to FIG. 1(G) are sectional views of an important part for a specific example of a manufacturing process of a semiconductor device including the manufacturing process of a tantalum oxide film according to this invention.
Figure 1B:
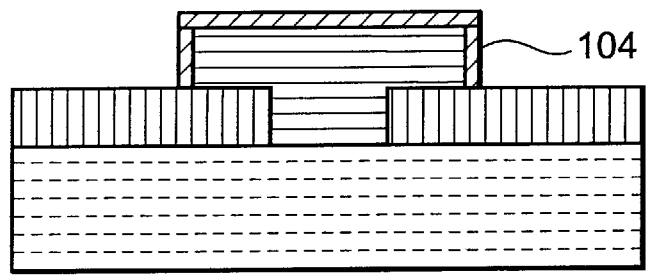

The present invention basically adopts a technical constitution as described in the following.

Namely, the manufacturing method of a tantalum oxide film according to this invention is characterized in that it includes a step of forming a tantalum oxide film in amorphous state, a step of heat treating the tantalum oxide film in amorphous state at a temperature which is higher than the temperature for formation of the tantalum oxide film in amorphous state and is lower than the temperature for crystallization of the tantalum oxide film in amorphous state, and a step of crystallizing the tantalum oxide film in amorphous state.

Moreover, it is also preferable to subject the tantalum oxide film in amorphous state to a step of heat treating at a temperature below 500° C., after a step of heat treating the film at a temperature which is higher than the temperature for formation of the tantalum oxide film in amorphous state and is lower than the temperature for crystallization of the tantalum oxide film in amorphous state, then subjecting the film to the heat treatment for crystallization.

Furthermore, it is also preferable to subject the tantalum oxide film in amorphous state to a step of heat treating in an active oxygen atmosphere, after a step of heat treating the film at a temperature which is higher than the temperature for formation of the tantalum oxide film in amorphous state and is lower than the temperature for crystallization of the tantalum oxide film in amorphous state, then subjecting the film to the heat treatment for crystallization.

In more detail, this invention is characterized in that following the formation of a tantalum oxide film by a CVD method using an organic tantalum as a material, and prior to the crystallization of the film, the film is subjected to a heat treatment in two stages.

That is, the tantalum oxide film in amorphous state is subjected first to a heat treatment at a first temperature, then is subjected consecutively to a heat treatment in an ozone atmosphere at a temperature lower than the first temperature.

More specifically, the first heat treatment is for removing moisture and impurities such as organic substances included in the tantalum oxide film. The following heat treatment in an ozone atmosphere, namely, the second heat treatment, is aimed at complementing oxygen for the portions of the film from which impurities are removed.

The first heat treatment is carried out at a temperature higher than that, of the formation of the tantalum oxide film, namely 400° C. Since the effect of removal of the impurities from the film is more conspicuous at higher temperatures, it is preferable to carry it out at a temperature higher than 500° C. However, the temperature of this heat treatment must not exceed the crystallization temperature (above 650° C.) of the tantalum oxide film.

Here, the atmosphere for the first heat treatment needs not necessarily contain oxygen, but it is more effective when the heat treatment is done under reduced pressure. A heat treatment under reduced pressure is more effective for removal of the impurities from the film than is done under normal pressure. More specifically, a pressure less than 10 Torr is preferable. The first heat treatment needs be continued for a period by which the impurities in the film are removed completely, and it is preferable that it is continued especially for over two minutes.

On the other hand, the second heat treatment is preferable that it is done at a temperature below 400° C. The second heat treatment is done in an ozone atmosphere, and the lifetime of ozone is reduced rapidly at temperatures above 400° C. Accordingly, the effect of oxidizing the tantalum oxide film is reduced if the second heat treatment is carried out at a temperature above 400° C.

Furthermore, in this invention, care needs be taken for not exposing the tantalum oxide film to the open air to the extent possible, between the first heat treatment at a high temperature and the subsequent heat treatment in the ozone atmosphere. More specifically, it is preferable that each heat treatment is executed while maintaining the heat treatment device in sealed conditions without taking out the film into the open air.

In other words, the condition of the film after the first heat treatment is such that impurities in the film are removed but the portions from which the impurities are removed are not supplemented by oxygen or the like. Accordingly, if the tantalum oxide film after the first heat treatment is exposed to the open air, the portions of the film from which the impurities are removed absorb moisture in the outer atmosphere. As a result, the effect of the heat treatment at a high temperature will be self-defeatedly lost.

For this reason, after the formation of the tantalum oxide film, the annealing processing is executed in two stages, and the heat treatment for crystallization is carried out thereafter. More specifically, the first heat treatment is carried out at a high temperature, and the next heat treatment is carried out at a low temperature in an atmosphere containing active oxygen. In this way, the tantalum oxide film includes fewer defects, and as a result, the leakage current is reduced.

In this invention, it is preferable that the tantalum oxide film is formed with pentaethoxy tantalum $Ta(C_2H_5OH)_5$ as the main constituent element.

Moreover, in this invention, it is preferable that the temperature of the first heat treatment does not exceed the crystallization temperature of the tantalum oxide film, and is higher than the temperature of formation of the tantalum oxide film. Furthermore, it is preferable that the temperature of the first heat treatment lies in the range of 400 to 650° C.

Moreover, in this invention, the first heat treatment process may be executed in a nitrogen atmosphere. Furthermore, it is preferable that the first heat treatment is executed under a reduced pressure.

It is preferable that the temperature of the second heat treatment in this invention is less than 400° C, and the second heat treatment is executed in an active oxygen atmosphere. Moreover, it is also preferable that the second heat treatment is executed in an ozone atmosphere.

Besides, it is preferable that the transfer of the tantalum oxide film, between the first heat treatment process and the second heat treatment process of this invention, does not include processes which will expose the tantalum oxide film to the open air.

In the following, referring to the drawings, the method of manufacturing the tantalum oxide film according to this invention and a specific example of a semiconductor device using the tantalum oxide film will be described in detail.

Namely, FIG. 1(A) to FIG. 1(G) are sectional views showing main steps of the method of manufacture a specific example of the tantalum oxide film according to this invention. These figures illustrate a manufacturing method of a tantalum oxide film in which following the formation of a tantalum oxide film, first, the film is subjected to a heat treatment at a first temperature, then the tantalum oxide film is subjected to a heat treatment at a second tempera-Lure which is lower than the first temperature in an atmosphere including active oxygen.

In other words, FIG. 1(A) to FIG. 1(G) show schematic sectional views of respective major processes in the manufacturing method of the tantalum oxide film according to the present invention.

First, as shown in FIG. 1(A), an insulating oxide film, for example, silicon oxide film 102, is formed on a silicon substrate 101, then an appropriate opening is formed in the insulating film. Then, a phosphorus-doped polysilicon film is formed in the opening and on the silicon insulating film 102, and a lower electrode pattern 103 for a capacitor is formed by patterning the polysilicon film.

Next, as shown in FIG. (B), a silicon nitride film 104 is formed by nitriding the surface of the electrode 103 by the rapid thermal nitriding (RTN) method. In this case, the conditions of the RTN processing are set so as to obtain a thickness of 2 nm for the silicon nitride film.

Figure 1C:
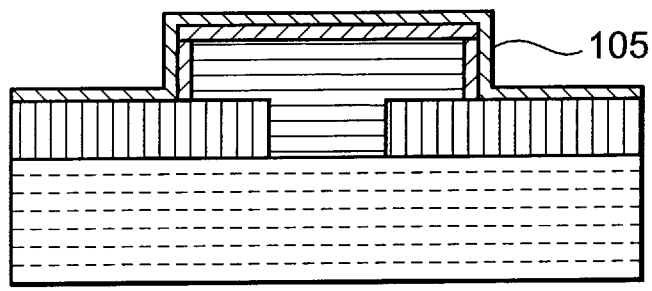

Next, as shown in FIG. 1(C), a tantalum oxide film 105 of thickness 10 nm is formed on the surface of the substrate and the electrode 103 by a low pressure CVD method. For the formation of the tantalum oxide film 105 use is made of pentaethoxy tantalum $Ta(C_2H_5OH)_5$ and oxygen as the raw materials. The flow rates of the raw materials are set to 0.1 ml/min for pentaethoxy tantalum and 2 SLM (standard liter/min) for oxygen, respectively. Besides, the pressure of the gas and the temperature of the substrate at the formation of the film are set to 1 Torr and 450° C., respectively.

In this example, the tantalum oxide film is formed using a low pressure CVD method, but this invention will not be affected even if a tantalum oxide film formed by another method and under other conditions is used.

Figure 1D:
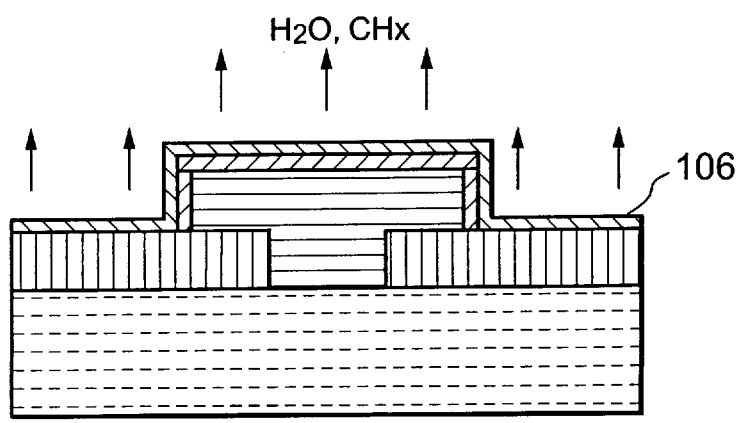

Next, following the formation of the tantalum oxide film, as shown in FIG. 1(D), the film is subjected to a heat treatment, namely, a first heat treatment, in a nitrogen atmosphere at 550° C. for 30 min, to form a tantalum oxide film 106 which is heat treated in a nitrogen atmosphere.

Figure 1E:
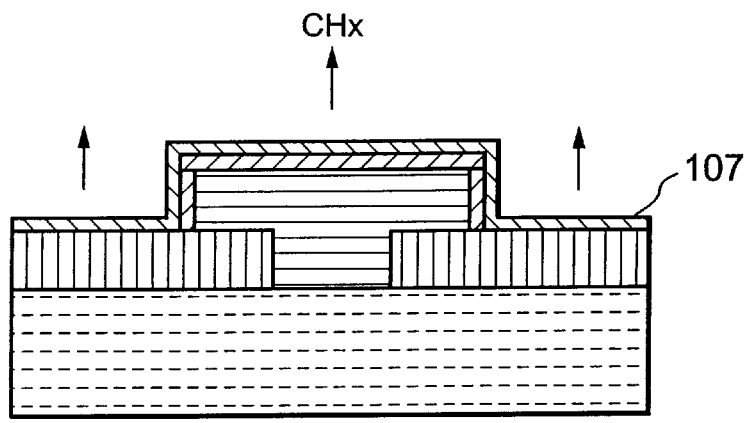

In succession to the foregoing, as shown in FIG. 1(E), the film is subjected to a heat treatment, namely a second heat treatment, in an ozone atmosphere at 300° C. for 10 min, to form a tantalum oxide film 107 which is heat treated in an ozone atmosphere.

During the first heat treatment shown in FIG. 1(D) and the second heat treatment shown in FIG. 1(E), the wafer is transferred in an atmosphere filled with nitrogen in order not to expose the film 106 to the outer air.

Figure 1F:
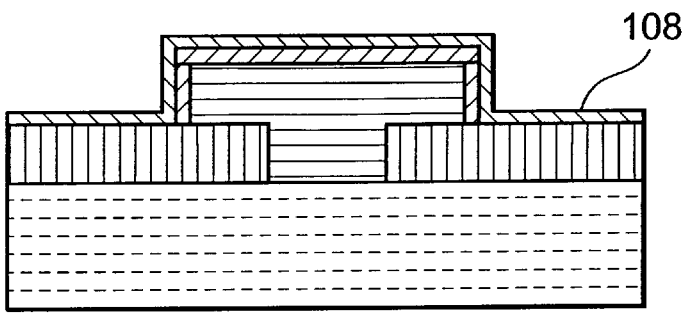

After the above heat treatments, the tantalum oxide film 107 is subjected to a furnace annealing in an oxygen atmosphere at 800° C. for 10 min to crystallize the tantalum oxide film 107, obtaining a semiconductor device having a crystallized tantalum oxide film 108 as shown in FIG. 1(F).

Figure 1G:
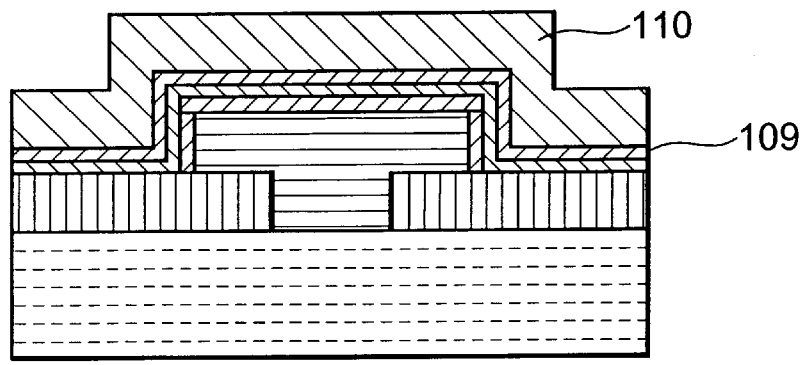

After this, as shown in FIG. 1(G), a titanium nitride film 109 and a phosphorus-doped polysilicon film 110 are formed on the crystallized tantalum oxide film 108 to thicknesses of 20 and 200 nm, respectively, by a CVD method. In this way, an upper electrode 120 composed of polysilicon 110 is formed.

Figure 2:
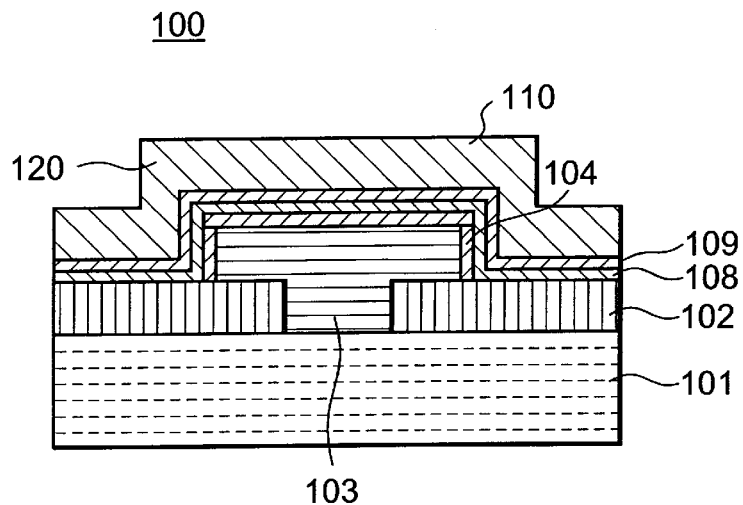
FIG. 2 is a sectional view of an important part for the specific example of the semiconductor device including the tantalum oxide film according to this invention.

Finally, the crystallized tantalum oxide film 108, the titanium nitride film 109, and the polysilicon film 110 are patterned in a desired form by photolithography and a dry etching method. Thus, a semiconductor device 100 having capacitor insulating film using the tantalum oxide film 108 is completed as shown in FIG. 2.

Here, the properties of the tantalum oxide film formed by the manufacturing method according to this invention, and the properties of a tantalum oxide film manufactured by the conventional method will be described below.

Figure 3:
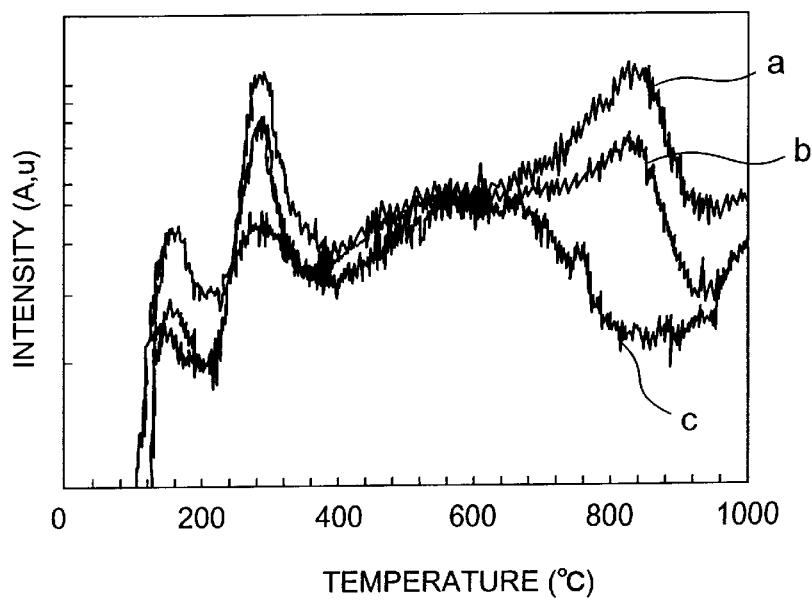
FIG. 3 is a graph showing a difference in a characteristic value for a tantalum oxide film according to this invention and a tantalum oxide film manufactured by the conventional method.
Figure 4:
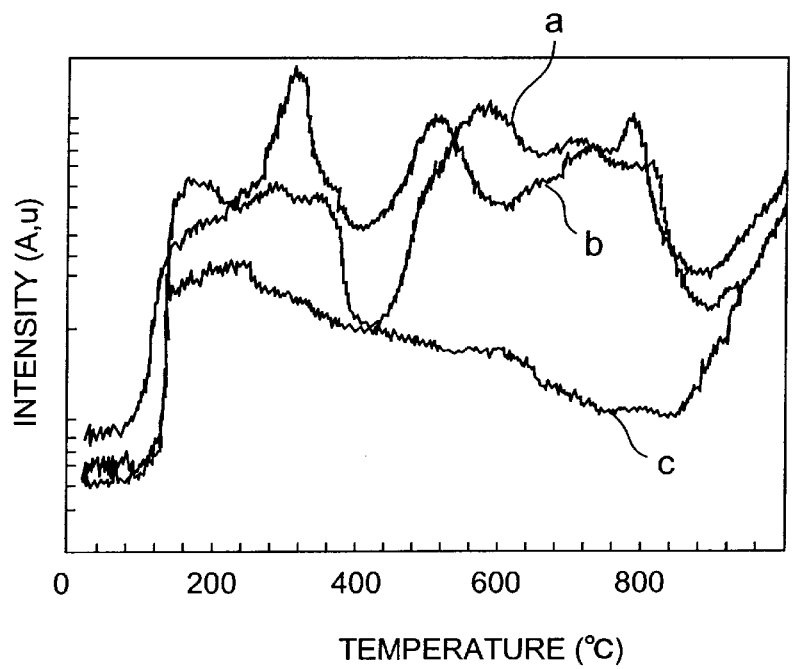
FIG. 4 is a graph showing a difference in another characteristic value for a tantalum oxide film according to this invention and a tantalum oxide film manufactured by the conventional method.

FIG. 3 and FIG. 4 show respectively the results of measurement for chemical substances with mass number 16 and 18 by thermal desorption spectroscopy (TDS), of the tantalum oxide film formed by the conventional manufacturing method and of the tantalum oxide film formed by this invention.

FIG. 3 shows the dependence of the number of a substance with mass number 16, namely, $CH_4$ represented as the intensity, detected from the tantalum oxide film, on the change in the temperature.

In addition, FIG. 4 shows the dependence of the number of a substance with mass number 18, namely, $H_2O$ represented as the intensity, detected from the tantalum oxide film, on the change in the temperature.

In FIG. 3 and FIG. 4, the curve (a) represents the intensity for the tantalum oxide film immediately after its formation by the low pressure CVD using an organic tantalum as the raw material. The curve (b) represents the intensity for the tantalum oxide film which is subjected to a heat treatment in an ozone atmosphere at 300° C. after its formation by the low pressure CVD using an organic tantalum as the raw material. Further, the curve (c) represents the intensity for the tantalum oxide film subjected to the first and the second heat treatments of this invention, namely, the tantalum oxide film which was formed by the low pressure CVD using an organic tantalum as the raw material, and was subjected to the heat treatment in a nitrogen atmosphere at 550° C., then subjected to the heat treatment in an ozone atmosphere at 300° C.

As can be seen from the curves in FIG. 3 and FIG. 4, although the tantalum oxide film (b) subjected to the heat treatment in the ozone atmosphere at 300° C. has both $CH_4$ intensity and $H_2O$ intensity reduced compared with those of the tantalum oxide film (a) immediately after the formation of the tantalum oxide film, their degree of reduction is not sufficiently large.

However, in the tantalum oxide film (c) which was subjected to the heat treatments of this invention, the reduction in the desorption amount of the respective impurities is very significant. Namely, when the first heat treatment and the second heat treatment according to this invention are applied to a tantalum oxide film formed, significant amounts of the impurities in the film are removed. Accordingly, the amounts of the impurities desorbed from the tantalum oxide film after the heat treatments are very small.

Figure 5:
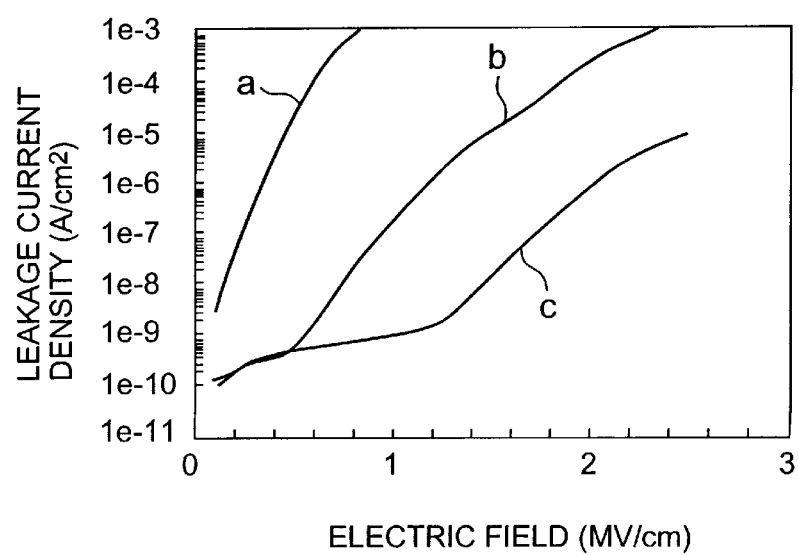
FIG. 5 is a graph showing a comparison between the leakage current in a semiconductor device manufactured by using a tantalum oxide film according to this invention and the leakage current in a semiconductor device manufactured by using a tantalum oxide film manufactured by the conventional method.

In FIG. 5 is shown the leakage current characteristic of the semiconductor device using the tantalum oxide film.

The curve (a) in FIG. 5 shows the leakage current characteristic of the semiconductor device when use is made of the tantalum oxide film immediately after its formation by the low pressure CVD method using an organic tantalum as the raw material. The curve (b) shows the leakage current characteristic when use is made of the tantalum oxide film subjected to the heat treatment in the ozone atmosphere at 300° C. after its formation by the low pressure CVD method using an organic tantalum as the raw material. Further, the curve (c) shows the leakage current characteristic when use is made of the tantalum oxide film subjected to the first heat treatment and the second heat treatment of this invention, namely, the tantalum oxide film subjected to the heat treatment in the nitrogen atmosphere at 550° C., then to the heat treatment in the ozone atmosphere at 300° C., after the film formation by the low pressure CVD method using an organic tantalum as the raw material.

As can be seen from a comparison of the curves in FIG. 5, the leakage current (c) for the tantalum oxide film subjected to the oxidation and heat treatment of the manufacturing method of the tantalum oxide film according to this invention reveals a reduction of the leakage current of several orders of magnitude compared with the leakage current (b) for the tantalum oxide film subjected to the heat treatment in the ozone atmosphere at 300° C. Accordingly, it is clear that the oxidation effect by the second heat treatment of this invention is very conspicuous. That is, since the impurities in the film are removed effectively by the heat treatment at the high temperature in the nitrogen atmosphere, namely, the first heat treatment, it can be seen that the oxidation by the succeeding second heat treatment can be executed very efficiently.

In the specific example in the above, the first heat treatment was executed in a nitrogen atmosphere, and the second heat treatment was executed in an ozone atmosphere. However, the heat treatments are not limited to these cases and different heat treatment may be applied to each heat treatment stage.

What is important in such a case is that the first heat treatment be executed at a high temperature, and the second heat treatment be executed in an active oxygen atmosphere. As long as the heat treatments satisfy these conditions it is possible to adopt conditions different from those in the specific example.

For example, it is promising to execute the first heat treatment under a reduced pressure, in which the removal of the impurities will proceed more effectively than under the normal pressure.

Moreover, it is also effective to execute the first heat treatment in an atmosphere containing oxygen. An oxygen atmosphere has an enhanced effect for the removal of the carbon-based impurities. By adopting such a method, it is possible to carry out an effective removal of the carbon-based impurities in addition to the removal of the moisture.

In the specific example, the second heat treatment is executed in an ozone atmosphere, but a higher effect can be expected if the heat treatment is carried out while irradiating ozone with an ultraviolet radiation because a larger amount of active oxygen will become available.

Moreover, a similar effect can be expected by executing the heat treatment in an oxygen atmosphere while irradiating oxygen with an ultraviolet radiation. This is because, similar to the above case, active oxygen can be produced by the irradiation of oxygen with an ultraviolet radiation. Furthermore, a similar effect can be expected by carrying the heat treatment while supplying oxygen passed through a plasma atmosphere.

Since the subsequent heat treatment is executed in an active oxygen atmosphere, it is possible to remove carbon-based impurities in the film.

In the above example, it is recommended not to expose the film to the open air between the first heat treatment and the second heat treatment. If the film is exposed to the open air, the film will absorb the moisture in the air, diluting the effect of the first heat treatment.

Accordingly, the transfer of the formed tantalum oxide film in a nitrogen atmosphere is desired, but the transfer of the film in a reduced pressure is also an effective method as an alternative.

The semiconductor device constructed by using the tantalum oxide film formed by this invention has a structure as, for example, shown in FIG. 2. The feature of this semiconductor device 100 is as described below. On the surface of the electrode part 103 formed via the opening provided in the layer insulating film 102 on the substrate 101, the tantalum oxide film 108 is formed via the silicon nitride film 104. The conductive film 120 is formed on the tantalum oxide film 108 via the titanium nitride film 109. This device has the property that the leakage current is small and the capacity is large.

Figure 6:
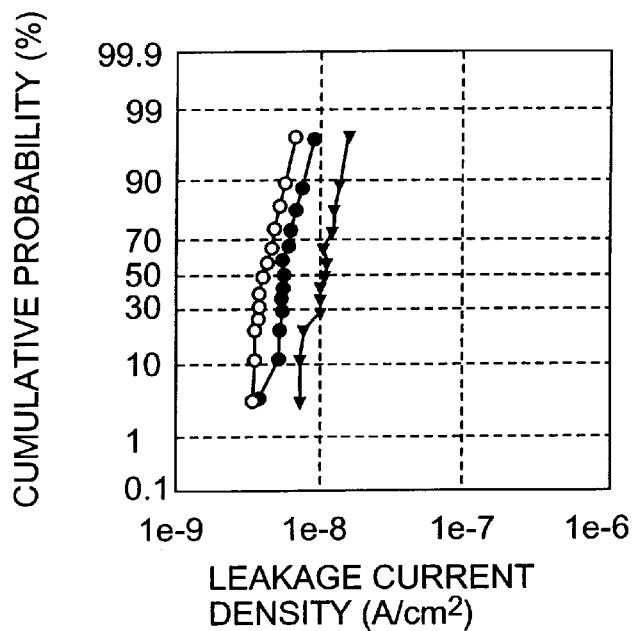
FIG. 6 is a graph showing examples of a characteristic value for a semiconductor device using a tantalum oxide film according to this invention.
Figure 7:
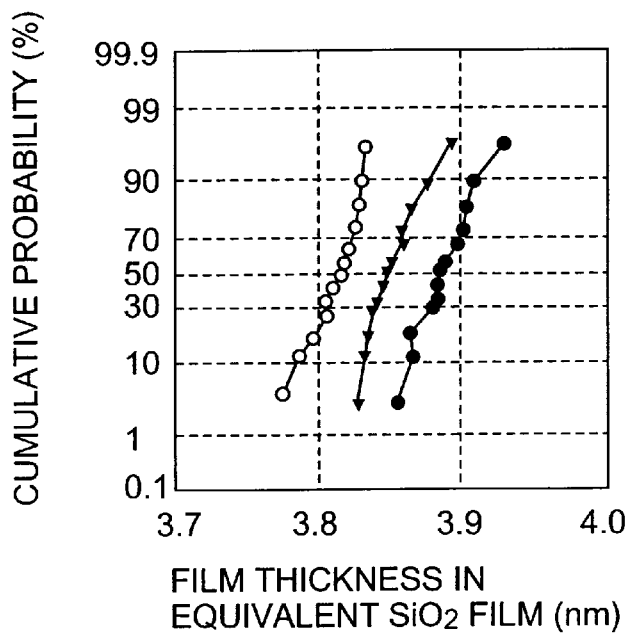
FIG. 7 is a graph showing examples of another characteristic value for a semiconductor device using a tantalum oxide film according to this invention.

The properties of one example 100 of the semiconductor device according to this invention are shown in FIG. 6 and FIG. 7.

Figure 8:
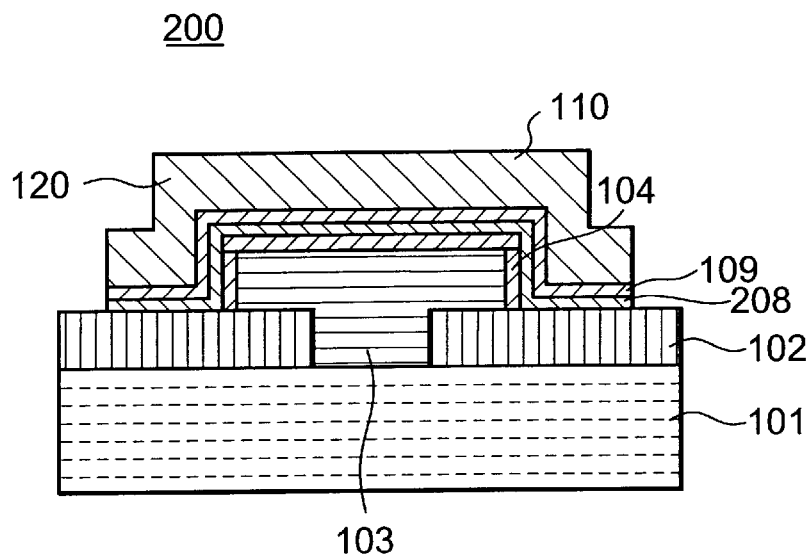
FIG. 8 is a sectional view of an important part of a specific example of a semiconductor device including a tantalum oxide film manufactured by the conventional method.
Figure 9:
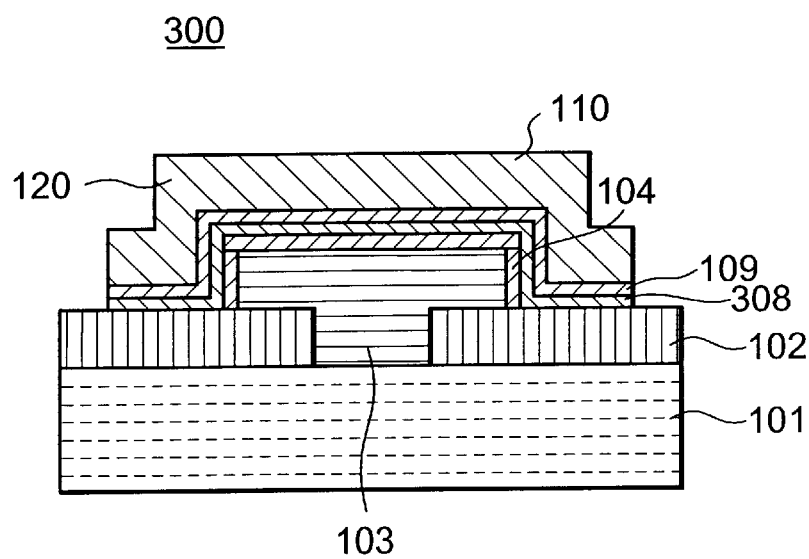
FIG. 9 is a sectional view of an important part of another specific example of a semiconductor device including a tantalum oxide film manufactured by the conventional method.

Namely, FIG. 6 is a graph showing the dependence of the occurrence probability on the leakage current distribution in terms of the normal logarithmic distribution for measurement at 13 points, for the case when a voltage of 1.2V is applied to the upper electrode of the semiconductor device 100 or 200 or 300 employing the tantalum oxide film 108 or 208 or 308 having a configuration as shown in FIG. 2 or FIG. 8 or FIG. 9. The ordinate represents the occurrence probability and the abscissa represents the leakage current density (A/cm$^2$).

Of the curves in FIG. 6, the curve drawn through the empty white circles shows the occurrence probability for the leakage current density, of the semiconductor device 100 employing the tantalum oxide film 108 subjected to the first heat treatment and the second heat treatment of the manufacturing method according to this invention, namely, the tantalum oxide film 108 obtained by subjecting the tantalum oxide film 105 formed by the low pressure CVD method using an organic tantalum as the raw material, to the heat treatment in a nitrogen atmosphere at 550° C., then subjecting the film to the heat treatment in an ozone atmosphere at 300° C. The curve drawn through the solid black circles shows the occurrence probability for the leakage current density, of the semiconductor device 200 employing the tantalum oxide film 208 formed by the conventional manufacturing method, namely, the tantalum oxide film 208 obtained by subjecting the tantalum oxide film 105 formed by the low pressure CVD method using an organic tantalum as the raw material, to the heat treatment in an ozone atmosphere under irradiation of an ultraviolet radiation at 400° C. The curve drawn through the solid black triangles shows the occurrence probability for the leakage current density, of the semiconductor device 300 employing the tantalum oxide film 308 formed by the conventional manufacturing method, namely, the tantalum oxide film 105 formed by the low pressure CVD method using an organic tantalum as the raw material, to a plain heat treatment.

As is clear from these curves, the curve (drawn through the empty circles) for the semiconductor device according to this invention is at the extreme left of all the curves in FIG. 6 including the curve (drawn through the solid black circles) for the semiconductor device 200 and the curve (drawn through the solid black triangles) for the semiconductor device 300 according to the conventional technique. This means that the semiconductor device according to this invention has the least occurrence probability for the leakage current of all the semiconductor devices including those according to the conventional technique.

In FIG. 7 are shown the curves of the occurrence probability for the leakage current measured in the same method as in FIG. 6, for the case where a voltage of 1V is applied to the upper electrode 120 for the semiconductor device 100 or 200 or 300 having the configuration as shown in FIG. 2 or FIG. 8 or FIG. 9, and the thickness of the tantalum oxide film 108 or 208 or 308 is set to 80 Å, with the thickness of the tantalum oxide film 105 converted to the equivalent thickness of silicon oxide film.

In other words, in the figure, the ordinate represents the occurrence probability, and the abscissa represents the thickness in nanometers (nm) of the tantalum oxide film 108, 208, and 308 converted to the equivalent thickness of silicon oxide film.

In the figure, the curve drawn through the empty circles shows the occurrence probability for the leakage current density of the semiconductor device 100 employing the tantalum oxide film 108 subjected to the first heat treatment and the second heat treatment of the manufacturing method according to this invention, namely, the tantalum oxide film 108 obtained by subjecting the tantalum oxide film formed by the low pressure CVD method using an organic tantalum, to the heat treatment in a nitrogen atmosphere at 550° C., then subjecting the film to the heat treatment in an ozone atmosphere at 300° C. The curve drawn through the solid black circles shows the occurrence probability for the leakage current density of the semiconductor device 200 employing the tantalum oxide film 208 formed by the conventional manufacturing technique, namely, the tantalum oxide film 208 obtained by subjecting the tantalum oxide film 105 formed by the low pressure CVD method using an organic tantalum as the raw material, to the heat treatment in an ozone atmosphere under irradiation of an ultraviolet radiation at 400° C. The curve drawn through the solid black triangles shows the occurrence probability for the leakage current of the semiconductor device 300 employing the tantalum oxide film 308 formed according to the conventional technique, namely, the tantalum oxide film 308 obtained by subjecting the tantalum oxide film 105 formed by the low pressure CVD method using an organic tantalum, to a plain heat treatment.

As is clear from these curves, the curve (drawn through the empty circles) for the semiconductor device 100 according to this invention is found at the extreme left in FIG. 7 for all cases of the semiconductor devices including the curve (drawn through the solid black circles) for the semiconductor device 200 and the curve (drawn through the solid black triangles) for the semiconductor device 300 obtained according to the conventional technique. This means that the semiconductor device according to this invention has the smallest thickness of the silicon oxide film required for holding electrical charges when the same amount of charges are imparted, among all the semiconductor devices including those manufactured according to the conventional technique.

These results show that the semiconductor device according to this invention has a higher capacity retaining performance than the device according to the conventional technique.

Since the manufacturing method according to this invention adopts the technical constitution as described in the above, it is possible to manufacture a tantalum oxide film having a high dielectric constant suitable for application to a high density DRAM, and a smaller leakage current. At the same time, it has an accompanying effect which facilitates the manufacture of a semiconductor device adopting the tantalum oxide film.

It is apparent that the present invention is not limited to the above embodiment, but may be modified and changed without departing from the scope and spirit of the invention.

What is claimed is:

1. A method of manufacturing a tantalum oxide film comprising:

forming a tantalum oxide film at a first temperature;

subjecting said tantalum oxide film to a first heating at a second temperature which is higher than said first temperature and lower than a third temperature for crystallization of said tantalum oxide film;

subjecting said tantalum oxide film, after said first heating, to a second heating at a fourth temperature which is not higher than said second temperature; and crystallizing said tantalum oxide film.

2. A method of manufacturing a tantalum oxide film comprising:

forming a tantalum oxide film in amorphous state at a first temperature;

subjecting said tantalum oxide film in amorphous state to a first heating at a second temperature which is higher than said first temperature and lower than a third temperature for crystallization of said tantalum oxide film in a nitrogen atmosphere; a subjecting said tantalum oxide film, after said first heating, to a second heating at a fourth temperature which is not higher than said second temperature; and crystallizing said tantalum oxide film in amorphous state.

3. The method of manufacturing a tantalum oxide film as claimed in claim 2, wherein said second heating of said tantalum oxide film is carried out in an active oxygen atmosphere.

4. The method of manufacturing a tantalum oxide film as claimed in claim 2, wherein said second heating of said tantalum oxide film is carried out in an ozone atmosphere.

5. The method of manufacturing a tantalum oxide film as claimed in claim 2, wherein said second heating of said tantalum oxide film is carried out in an ozone atmosphere irradiated with ultraviolet radiation.

6. The method of manufacturing a tantalum oxide film as claimed in claim 2, wherein said second heating of said tantalum oxide film is carried out in an oxygen atmosphere irradiated with ultraviolet radiation.

7. The method of manufacturing a tantalum oxide film as claimed in claim 2, wherein said second heating of said tantalum oxide film is carried out by supplying oxygen passed through a plasma atmosphere.

8. The method of manufacturing a tantalum oxide film as claimed in claim 2, wherein said second temperature is in the range of 400° C. to 700° C.

9. The method of manufacturing a tantalum oxide film as claimed in claim 2, wherein said first heating of said tantalum oxide film is carried out under a reduced pressure.

10. The method of manufacturing a tantalum oxide film as claimed in claim 2, wherein said second heating of said tantalum oxide film is carried out under a pressure not exceeding 10 Torr.

11. The method of manufacturing a tantalum oxide film as claimed in claim 1, wherein said first heating of said tantalum oxide film is carried out in an oxygen atmosphere.

12. The method of manufacturing a tantalum oxide film as claimed in claim 2, wherein said tantalum oxide film is formed using pentaethoxy tantalum Ta(C2H5OH)5 as a material.

13. The method of manufacturing a tantalum oxide film as claimed in claim 2, wherein said tantalum oxide film is formed by a low pressure CVD method at said first temperature not higher than 450° C.

14. The method of manufacturing a tantalum oxide film as claimed in claim 2, wherein said method does not include a step which will expose said tantalum oxide film to the open air between said first heat treating and said second heating.

* * * * *